US009697907B2

(12) United States Patent
Tanzawa et al.

(10) Patent No.: US 9,697,907 B2
(45) Date of Patent: *Jul. 4, 2017

(54) APPARATUSES AND METHODS USING DUMMY CELLS PROGRAMMED TO DIFFERENT STATES

(71) Applicant: MICRON TECHNOLOGY, INC., Boise, ID (US)

(72) Inventors: Toru Tanzawa, Adachi (JP); Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/227,623

(22) Filed: Aug. 3, 2016

(65) Prior Publication Data
US 2016/0343446 A1    Nov. 24, 2016

Related U.S. Application Data

(63) Continuation of application No. 14/509,953, filed on Oct. 8, 2014, now Pat. No. 9,412,451.

(51) Int. Cl.
| G11C 16/04 | (2006.01) |
| G11C 16/28 | (2006.01) |
| G11C 7/02 | (2006.01) |
| G11C 16/34 | (2006.01) |
| G11C 16/10 | (2006.01) |
| G11C 16/08 | (2006.01) |
| G11C 16/24 | (2006.01) |

(52) U.S. Cl.
CPC ............. *G11C 16/28* (2013.01); *G11C 7/02* (2013.01); *G11C 16/0483* (2013.01); *G11C 16/08* (2013.01); *G11C 16/10* (2013.01); *G11C 16/24* (2013.01); *G11C 16/3427* (2013.01)

(58) Field of Classification Search
USPC ........................... 365/185.2, 185.17, 230.04
See application file for complete search history.

(56) References Cited

U.S. PATENT DOCUMENTS

| 5,680,347 A * | 10/1997 | Takeuchi ............ G11C 7/12 365/185.05 |
| 7,652,926 B2 | 1/2010 | Kang et al. |
| 8,547,750 B2 | 10/2013 | Yip |
| 2012/0257450 A1* | 10/2012 | Yip ............ G11C 16/0483 365/185.2 |
| 2016/0042791 A1 | 2/2016 | Sakui |

* cited by examiner

Primary Examiner — Vu Le
(74) Attorney, Agent, or Firm — Dorsey & Whitney LLP (57) ABSTRACT

Apparatuses and methods for reducing capacitive loading are described. One apparatus includes a first memory string including first and second dummy memory cells, a second memory string including third and fourth dummy memory cells, and a control unit configured to provide first and second control signals to activate the first and second dummy memory cells of the first memory string and to further deactivate at least one of the third and fourth dummy memory cell of the second memory string.

27 Claims, 7 Drawing Sheets

APPARATUSES AND METHODS USING DUMMY CELLS PROGRAMMED TO DIFFERENT STATES

CROSS-REFERENCE TO RELATED APPLICATION

This application is a continuation of U.S. patent application Ser. No. 14/509,953, filed Oct. 8, 2014, issued as U.S. Pat. No. 9,412,451 on Aug. 9, 2016, entitled "APPARATUSES AND METHODS USING DUMMY CELLS PROGRAMMED TO DIFFERENT STATES." This application and patent are incorporated by reference herein in their entirety and for all purposes.

BACKGROUND

Memory cell density, such as that of non-volatile memory, has been improved significantly in an effort to achieve greater storage capacity, while not significantly increasing cost or memory footprint. One widely adopted solution has been to implement memory cells in three-dimensions, for instance, using vertically oriented NAND strings.

Implementing memories in this manner has presented challenges, however. By way of example, as a result of three-dimensional implementation, block sizes have increased, and as a corollary, capacitive and resistive loads generated during operation have increased as well.

DETAILED DESCRIPTION

Apparatuses and methods for reducing capacitive loading are described herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
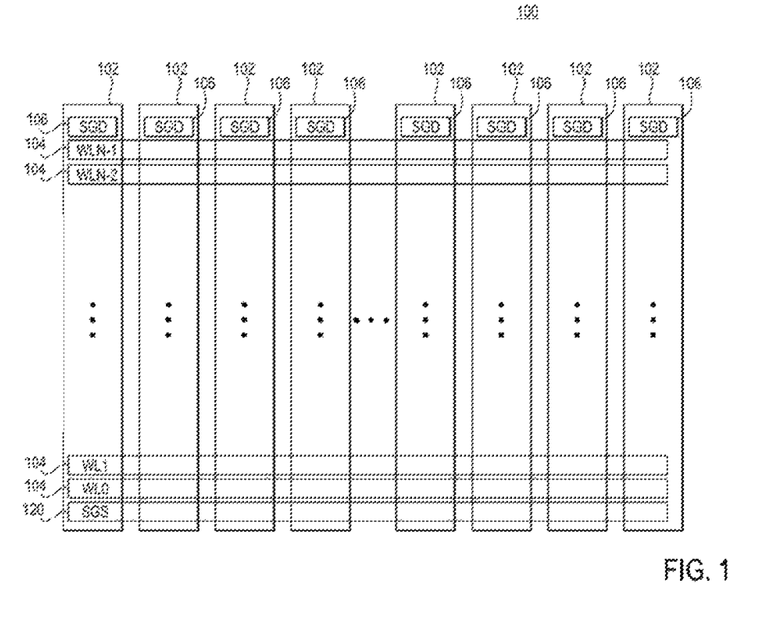
FIG. 1 is a schematic block diagram of an apparatus including a memory block according to an embodiment of the present invention.

FIG. 1 is a block diagram of an apparatus that includes a memory block 100 according to an embodiment of the present invention. As used herein, apparatus may refer to, for example, an integrated circuit, a memory device, a memory system, an electronic device or system, a smart phone, a tablet, a computer, a server, etc. The memory block 100 includes a plurality of memory subblocks 102, a plurality of memory access lines (e.g., word lines) 104, a plurality of select gate drain (SGD) control lines 106, and a select gate source (SGS) control line 120. Each of the SGD control lines 106 may be associated with a respective memory subblock 102 and the SGS control line 120 may be associated with a respective plurality of memory subblocks 102. A control unit (not shown in FIG. 1) may include control logic and may provide control signals to various circuits in the apparatus. For example, the control unit may provide control signals to the access lines 104, SGD control lines 106, and/or SGS control line 120. The control signals may provide signals to control various memory operations. Examples of specific memory operations are described below.

In some examples, each of the memory subblocks 102 may include a plurality of memory cells, such as non-volatile memory cells (e.g., NAND memory cells) that may be arranged in rows and/or columns. In some examples, each of the memory cells may be a single-level cell (SLC) and/or may be a multi-level cell (MLC). In this manner, each memory cell may be programmed to distinct voltage states, each of which may correspond to a particular representation of binary data (e.g., partial bit data, single bit data 0, 1, multi-bit data 00, 01, 10, 11).

The plurality of memory cells may be implemented using one or more NAND strings within each memory subblock 102. Each string may, for instance, include 32 non-volatile memory cells, or may include a greater or lesser number of memory cells, and memory cells of each string may share a common channel. Each memory subblock 102 may include any number of strings.

In some examples, an SGD gate may be configured to selectively couple a string to a data line VBL (not shown in FIG. 1) and an SGS gate may be configured to selectively couple a string to a source SRC (not shown in FIG. 1). In some embodiments, the source may be a line, a region, a note, a slot, and/or a layer of the memory block. By way of example, an SGD gate coupled to a string included in a memory subblock 102 may be coupled to a respective SGD control line 106 associated with the memory subblock 102. Providing (e.g., asserting) as control signal (e.g., active control signal) on the SGD control line 106 may activate (e.g., enable) the respective SGD gate, thereby coupling the associated string to the data line VBL. An SGD control line 106 providing a control signal to activate the SGD gate in this manner is described herein as an "active" SGD control line 106. Similarly, an SGS gate of a memory subblock 102 may be coupled to an SGS line 120 associated with the memory subblock 102. Providing a control signal on the SGS line 120 may activate the SGS gate, thereby coupling the respective string to the source. An SGS control line 120 providing a control signal to activate the SGS gate in this manner is described herein as an "active" SGS control line 120.

Providing (e.g., deasserting) a control signal (e.g., inactive control signal) on the SGD control line 106 may deactivate the respective SGD gate, thereby decoupling the associated string from the data line VBL. An SGD control line 106 providing a control signal to deactivate the SGD gate in this manner is described herein as an "inactive" SGD control line 106. Providing a control signal on the SGS line 120 may deactivate the SGS gate, thereby decoupling the respective string to the source. An SGS control line 120 providing a control signal to deactivate the SGS gate in this manner is described herein as an "inactive" SGS control line 120.

In some examples, control signals provided on respective SGD control lines 106 and SGS control lines 120, respectively, may be provided by the control unit. The control unit may be coupled to each of the SGD control lines 106 and the SGS control line 120, and may be configured to provide control signals to perform respective memory operations, described herein. The control unit may be implemented in software and/or hardware, and may include any circuitry and/or logic required to perform operations. In some examples, the control unit may be included in the block 100 and in other examples, the control unit may be located outside of the block 100, for instance, in a row decoder, an address decoder, control logic coupled to the block 100 and/or a controller. In this manner, one or more portions of the circuitry and/or logic of the control unit may be employed in a distributed configuration.

Each SGD control line 106 may be associated with a respective memory subblock 102 of the block 100, each memory access line 104 may be associated with all memory subblocks 102 of the block 100, and/or the SGS control line 120 may be associated with all memory subblocks 102 of the block 100. Accordingly, each SGD control line 106 may be included, at least in part, in a respective memory subblock 102 and may be coupled to the SGD gate of the corresponding memory subblock 102. In this manner, each active SGD control line 106 may couple the string or strings of a respective memory subblock 102 to a set of signal lines shared, for instance, by each memory subblock 102. A memory access line 104 may be coupled to a memory cell of a string in each memory subblock 102 of the block 100. As a result, a memory access line 104 may span across all memory subblocks 102 of the block 100 and may be coupled to each memory cell of a particular row of memory cells. Each SGS control line 120 may span across all memory subblocks 102 and may be coupled to the SGS gates of the memory subblocks 102. In this manner, an active SGS control line 120 may couple strings of the memory subblocks 102 to a source (SRC).

Generally, memory operations (e.g., read operations, program operations, erase operations) may be performed on one or more selected memory subblocks 102 while all other memory subblocks 102 may be unselected. Furthermore, memory operations may be performed on one or more selected strings within one or more memory subblocks 102 while all other strings may be unselected. Performing a memory operation on one or more selected memory subblocks 102 may include selectively activating SGD gates, SGS gates, and/or memory cells. Description of memory operations is made herein with respect to individual memory subblocks 102 and/or strings within the memory subblocks 102. It will be appreciated, however, that in some examples, one or more described operations may be applied simultaneously to any number of memory subblocks 102 and/or strings. Moreover, reference is made herein to selectively activating SGD and SGS gates to perform memory operations. As described, SGD and SGS gates may be activated by providing control signal on SGD control lines 106 or SGS control lines 120, respectively, and control signals provided in this manner may be provided by the control unit.

Figure 2:
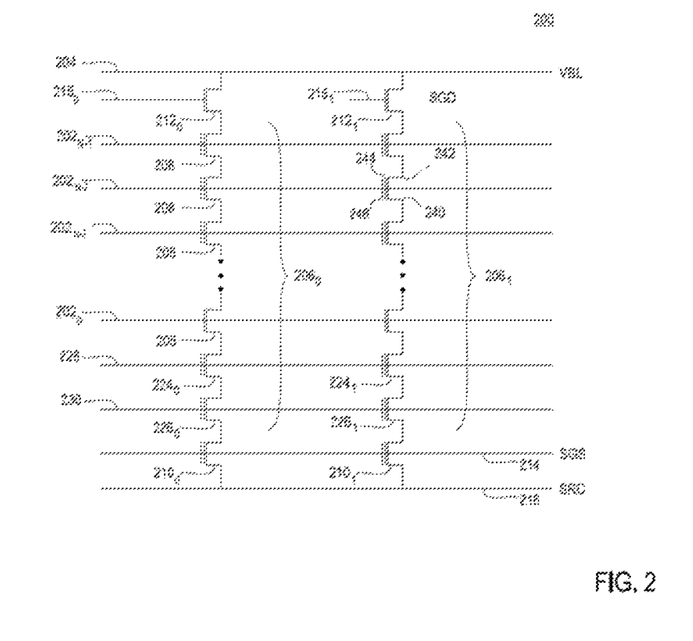
FIG. 2 is a schematic diagram of a NAND string of a subblock according to another embodiment of the present invention.

FIG. 2 illustrates a memory array 200 according to an embodiment of the invention. The memory array 200 may be a NAND memory array. The memory array 200 may be used as a portion of memory subblock 102.

As shown in FIG. 2, the memory array 200 includes access lines, which will be referred to as word lines (which may comprise commonly coupled control gates $202_0$ to $202_{N-1}$), and further includes data lines, such as bit line (VBL) 204. For ease of addressing in the digital environment, the number of word lines 202 and the number of bit lines 204 are generally each some power of two.

Memory array 200 includes strings of memory cells, e.g., strings $206_0$ and $206_1$. Strings $206_{0-1}$ may be included in a memory subblock 102, shown in FIG. 1. Each string of memory cells 206 includes transistors 208. The transistors 208, depicted as floating-gate transistors in FIG. 2, represent non-volatile memory cells to store user data. The floating-gate transistors 208 of each string of memory cells 206 are connected in series between one or more source select gates 210, e.g., a field-effect transistor (FET), and one or more drain select gates 212, e.g., an FET. Each source select gate 210 is coupled to a source select (SGS) control line 214, while each drain select gate 212 is coupled to a respective drain select (SGD) control line 215.

The strings of memory cells 206 of memory array 200 further include additional memory cells, such as "dummy" memory cells 224 and 226. The dummy memory cells 224/226 may have the same structure as the remaining memory cells of the strings of memory cells 206. Memory cells 224/226 may include transistors similar to transistors 208, for example, floating-gate transistors. However, the dummy cells may serve a different purpose. For example, the memory array 200 may be structured such that data values of the dummy memory cells 224/226 are not output from the memory device during a read operation, and/or dummy memory cells 224/226 are not used to store user data.

A source of each source select gate 210 is connected to a source (SRC) 216. The drain of each source select gate 210 is connected to the first dummy memory cell 226 of the corresponding string of memory cells 206. For example, the drain of source select gate $210_1$ is connected to dummy memory cell $226_1$ of the corresponding string of memory cells $206_1$ coupled to dummy word line 230. A control gate of each source select gate 210 is connected to source select line 214.

The drain of each drain select gate 212 is connected to a bit line 204. For example, the drain of drain select gate $212_1$ and the drain of drain select gate $212_0$ is connected to the bit line 204. The source of each drain select gate 212 is connected to last floating-gate transistor 208 of the corresponding string of memory cells 206. For example, the source of drain select gate $212_0$ is connected to floating-gate transistor 208 of the corresponding string of memory cells $206_0$ coupled to word line $202_{N-1}$.

Typical construction of floating-gate transistors 208 includes a floating gate 244 as a charge storage structure and a control gate 246, as shown in FIG. 2. Floating-gate transistors 208 have their control gates 246 coupled to a word line 202 (e.g., the control gates may be commonly coupled to form a word line). A row of the floating-gate transistors 208 is typically two or more floating-gate transistors 208 commonly coupled to a given word line 202.

In reading a selected memory cell of the memory array 200, i.e., a particular floating-gate transistor 208 of a string of memory cells 206, sensing devices (not shown in FIG. 2) may look for a voltage drop on a bit line 204 coupled to the selected memory cell. For example, the selected bit line 204 may be precharged to a precharge voltage (Vpchg), such as 1.0V. When a read voltage (Vread) is applied to the word line 202 coupled to the selected memory cell and pass voltages (Vpass) are applied to remaining word lines 202 of the same string of memory cells 206, the bit line 204 will lose charge, and thus voltage, if the selected memory cell is activated, but the bit line 204 will tend to maintain its charge if the selected memory cell remains deactivated. The data value of the selected memory cell is sensed sometime after applying the read voltage, such as by looking at the voltage of the bit line 204. The selected memory cell may be deemed to have a first data value if the bit line falls below some predetermined voltage, e.g., 0.2V, but a second data value if the bit line voltage is higher than the predetermined voltage.

During a read operation, it is generally desired to maintain the channel of the unselected string 206, i.e., the string $206_1$ not associated with the selected memory cell, at a constant voltage in order to reduce the effects of parasitic capacitive coupling. Various embodiments mitigate charge loss of the unselected bit line 204 through the use of two or more dummy memory cells 224 and 226. The dummy memory cells 224/226 may also be configured to reduce gate-to-channel capacitance of the unselected string. For example, the dummy memory cells 224/226 may be configured to float the channel of the unselected string. This may reduce the energy required to drive the channel of the unselected string to a desired voltage. The dummy memory cells 224/226 may be programmed by control signals provided by a control unit (not shown in FIG. 2). The control unit may provide signals to set desired threshold voltages of the dummy memory cells. The threshold voltages of the dummy memory cells may be programmed by control signals from the control unit during manufacture of the memory array 200 or after manufacture, for example, by a customer who has purchased the memory array 200.

In general, the dummy memory cells 224/226 are programmed to have threshold voltages arranged such that a single control signal applied to dummy access line (e.g., dummy word line) 228/230, respectively, is capable of activating one dummy memory cell 224/226, e.g., dummy memory cell $224_0/226_0$, while deactivating the adjacent dummy memory cell 224/226, e.g., dummy memory cell $224_1/226_1$. This relationship could be repeated across more than two strings of memory cells 206, such as in an alternating pattern. For example, a single control signal applied to dummy word line 228 might activate all even dummy memory cells 224 while deactivating all odd dummy memory cells 224 for dummy memory cells 224 numbered sequentially along the length of the dummy word line 228. For example, even dummy memory cells 224 could have target threshold voltages of 0V while odd dummy memory cells 224 could have target threshold voltages of 5V. In this manner, a 3V control signal applied to dummy word line 228 would activate all even dummy memory cells 224 while deactivating all odd dummy memory cells 224. While only even dummy memory cell $224_0/226_0$ and odd dummy memory cell $224_1/224_6$ are depicted in the figures, it will be apparent that the structure depicted in FIG. 2 could be continued to the right in a repeating pattern. In addition, while certain dummy memory cells 224/226 may have the same programmed state, it is recognized that programming any such memory cell to a programmed state will generally lead to a distribution of threshold voltages around the target value, depending upon the algorithms used for the programming of any such memory cell. For example, it is well known that using small incremental changes in programming voltages will generally allow for tighter threshold voltage distributions compared with using large incremental changes in programming voltages, but will also generally lead to longer programming times. Thus, a compromise is typically made between having tighter threshold voltage distributions and having shorter programming times.

It is noted that the target threshold voltages of all even or odd dummy memory cells 224/226 need not be the same. For example, the even dummy memory cells 224/226 could have a variety of target threshold voltages corresponding to a first programmed state, e.g., a variety of target threshold voltages between 0V and 2V, and the odd dummy memory cells 224/226 could have a variety of target threshold voltages corresponding to a second programmed state, e.g., a variety of target threshold voltages between 4V and 6V, and a 3V control signal applied to dummy word line 228/230 would activate all even dummy memory cells 224/226 while deactivating all odd dummy memory cells 224/226. Other values of target threshold voltages may be used and it would be trivial to determine whether such other values would facilitate activating one dummy memory cell 224/226 while deactivating an adjacent dummy memory cell 224/226.

To facilitate current flow through the dummy memory cells 224/226 of the string of memory cells 206 containing the selected memory cell while floating and/or mitigating current flow through the dummy memory cells 224/226 of an unselected string of memory cells 206, the pattern of target threshold voltages of the dummy memory cells 224 are different than, e.g., opposite of, the pattern of target threshold voltages of the dummy memory cells 226. For example, if the pattern of target threshold voltages of the dummy memory cells 224 permit a single control signal to activate dummy memory cell $224_0$ and deactivate its adjacent dummy memory cell $224_1$, the pattern of target threshold voltages of the dummy memory cells 226 would permit a single control signal to deactivate dummy memory cell $226_0$ and activate its adjacent dummy memory cell $226_1$. In this manner, a control signal can be applied to dummy word line 228 sufficient to activate dummy memory cell $224_0$ and deactivate its adjacent dummy memory cell $224_1$, e.g., a control signal having a potential greater than the threshold voltage of dummy memory cell $224_0$ and less than the threshold voltage of dummy memory cell $224_1$, while a control signal can be applied to dummy word line 230 sufficient to activate both dummy memory cell $226_0$ and its adjacent dummy memory cell $226_1$, e.g., a control signal having a potential greater than the threshold voltages of both dummy memory cell $226_0$ and dummy memory cell $226_1$, to permit current flow through the string of memory cells $206_0$ dependent only on the data value of the selected memory cell, while mitigating current flow through the string of memory cells $206_1$ regardless of the data value of its memory cell sharing the same word line 202 as the selected memory cell.

Although the architecture of memory array 200 is described with specific reference to floating-gate memory cells, other memory cells are also suitable for such architectures, such as phase-change memory cells, ferroelectric memory cells, charge trap memory cells, etc. Furthermore, while the dummy memory cells 224 and 226 are depicted to be located only at the end of the string of memory cells 206 nearest their associated SGS control line 214, these dummy memory cells 224 and 226 may be located anywhere in the string of memory cells 206, and even separated from each other, e.g., dummy memory cell 224 at one end of the string of memory cells 206 and dummy memory cell 226 at the other end of the string of memory cells 206, as their function of facilitating current flow in one string of memory cells 206 and mitigating current flow in an adjacent string of memory cells 206 may be accomplished regardless of their relative location within those strings of memory cells 206. In addition, because the dummy memory cells 224 may act in concert to facilitate current flow in one string of memory cells 206 and mitigate current flow in an adjacent string of memory cells 206, one or both of the select gates 210 and 212 may be eliminated from the architecture depicted in FIG. 2.

Although the foregoing examples show only two dummy memory cells, additional dummy memory cells could be used. For example, to provide added mitigation of current flow through the unselected memory strings, an extra set of dummy memory cells could be added to each string of memory cells. In this example, it will be apparent that all four dummy memory cells could be activated in one string of memory cells, while activating less than all, e.g., two, dummy memory cells in an adjacent string of memory cells. While odd numbers of dummy memory cells could also be used, such would result in different numbers of deactivated dummy memory cells depending upon which string of memory cells contains the selected memory cell.

The dummy cells in each string may be coupled across the strings by dummy word lines. The strings may be included in a single subblock 102, multiple subblocks 102 as shown in FIG. 1, or across multiple blocks.

Figure 3A:
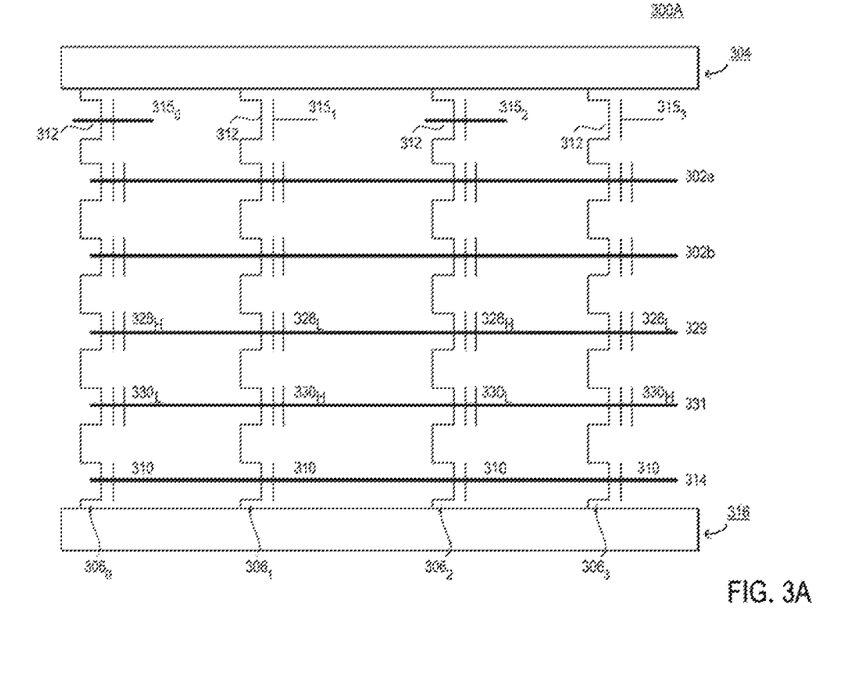
FIG. 3A is a schematic diagram of a NAND subblock according to an embodiment of the present invention.
Figure 3B:
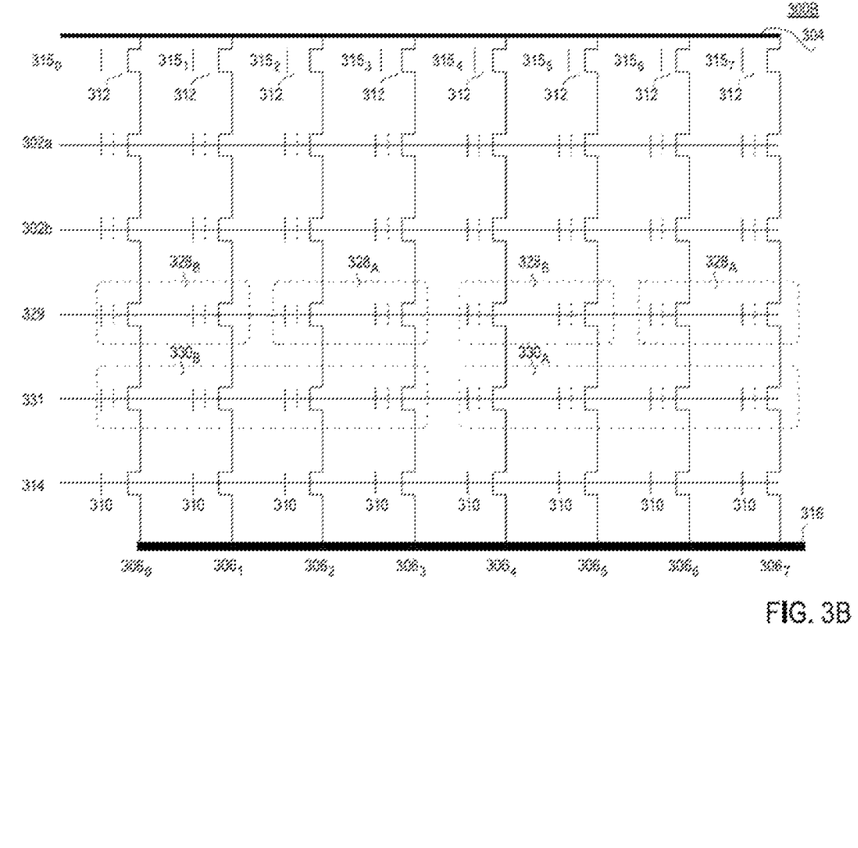
FIG. 3B is a schematic diagram of a NAND subblock according to another embodiment of the present invention.
Figure 3C:
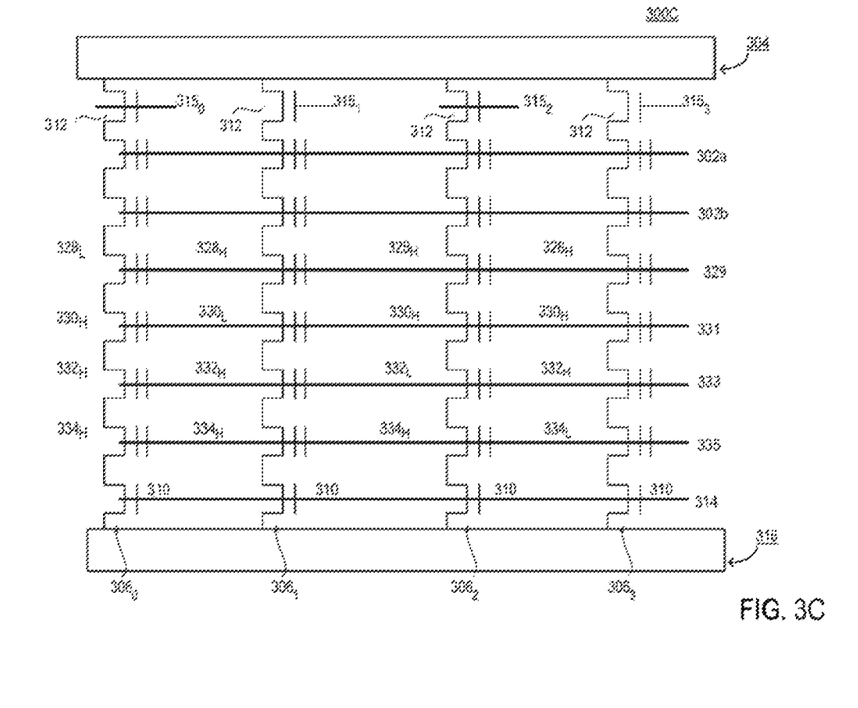
FIG. 3C is a schematic diagram of a NAND subblock according to a further embodiment of the present invention.

FIGS. 3A-C illustrate examples of the dummy word line implementation according to embodiments of the disclosure. FIG. 3A illustrates a plurality of memory strings $306_{0-3}$. The plurality of strings may be coupled to a SRC 316 through respective source select gates 310. The source select gates may be coupled to a SGS control line 314. The plurality of strings may be further coupled to a bit line 304 through respective drain select gates 312. Each drain select gate 312 may be coupled to a separate SGD control line $315_{0-3}$. A plurality of word lines 302a, 302b are also coupled to the plurality of strings. Dummy word lines 329 and 331 are coupled to the plurality of strings in the subblock. Although a certain number of strings and word lines are shown in FIG. 3A, it will be understood that any number of strings and word lines may be used in a subblock such as subblock 300A. The dummy word line 329 may have dummy memory cells that are programmed to have threshold voltages arranged such that a single control signal applied to dummy word line 329 is capable of activating (e.g., becoming conductive) dummy memory cells $328_L$ while deactivating (e.g., remaining non-conductive) the adjacent dummy memory cells $328_H$ in an alternating pattern as shown in FIG. 3A. This may deactivate and/or "float" the strings coupled to the deactivated dummy memory cells. The dummy word line 331 may have dummy memory cells that are programmed to have threshold voltages arranged such that a single control signal applied to dummy word line 331 is capable of activating dummy memory cells $330_L$ while deactivating the adjacent dummy memory cells $330_H$ in an alternating pattern, which is opposite to the alternating pattern used in dummy word line 329. This may deactivate and/or "float" the strings coupled to the deactivated dummy memory cells. As a result, the gate-to-channel capacitance may be reduced by half during a memory access operation because one-half of the four strings are coupled to the SRC 316 while the other half of the four strings remain floating during a memory access operation.

In one example, dummy memory cells $328_L$, $330_L$ could have relatively low target threshold voltages (e.g., 0V) while dummy memory cells $328_H$, $330_H$ could have relatively high target threshold voltages (e.g., greater than 0V and less than 5V). The relatively low target threshold voltage is less than the relatively high target threshold voltage. In this manner, a control signal having a voltage greater than the threshold voltage of dummy memory cells $328_H$, for example, 5V, applied to dummy word line 329 and a control signal having a voltage greater than or equal to the threshold voltage of dummy memory cells $330_L$ but less than the threshold voltage of dummy memory cells $330_H$ applied to dummy word line 331, for example, 0V, would activate all dummy memory cells $328_L$ and activate all dummy memory cells $328_H$, and while the dummy memory cells $330_L$ are activated, the dummy memory cells $330_H$ remain deactivated. As a result, strings $306_0$ and $306_2$ may be coupled to the SRC 316 when the source select gates 310 are activated by an active control signal provided on the SGS control line 314, while strings $306_1$ and $306_3$ remain decoupled from the SRC 316. Similarly, a control signal having a voltage greater than the threshold voltage of dummy memory cells $330_H$ (e.g., 5V) applied to dummy word line 330, and a control signal having a voltage greater than or equal to the threshold voltage of dummy memory cells $328_L$ but less than the threshold voltage of dummy memory cells $328_H$ applied to dummy word line 328, for example, 0V, would activate all dummy memory cells $330_L$ and all dummy memory cells $330_H$, and while the dummy memory cells $328_L$ are activated, the dummy memory cells $328_H$ remain deactivated. As a result, strings $306_1$ and $306_3$ may be coupled to the SRC 316 when the source select gates 310 are activated by an active control signal provided on the SGS control line 314, while strings $306_0$ and $306_2$ remain decoupled from the SRC 316. Other threshold voltage levels may be used without departing from the scope of the invention.

Other patterns of programmed dummy memory cells on dummy word lines may also be used. FIG. 3B illustrates an alternate configuration of the dummy memory cells in subblock 300B according to an embodiment of the invention. The subblock 300B may have similar components to subblock 300A. The discussion of these components will not be repeated with respect to FIG. 3B, as like reference numerals describe substantially similar components.

In the embodiment of FIG. 3B, a first set of several dummy cells $328_A$, $330_B$ in each dummy word line 329, 331 are programmed to a same state, for example, a same threshold voltage. This first set of dummy cells $328_A$, $330_B$ is adjacent to a second set of dummy cells $328_B$, $330_A$ that are programmed to a different state. In the embodiment shown in FIG. 3B, the dummy cells $328_A$ of the first set is adjacent to the dummy cells $328_B$ of the second set, as the sets include dummy cells on adjacent strings alone word line 329. Similarly, the first set of dummy cells $330_A$ is adjacent to the second set of dummy cells $330_B$, as the sets include dummy cells on adjacent strings along word line 331. Continuing this example, the threshold voltage of each set of dummy cells may alternate between dummy word lines. The dummy word lines 329, 331 may have dummy memory cells $328_A$, $328_B$ and $330_A$, $330_B$, respectively, that are programmed to have threshold voltages such that a control signal applied to each of the dummy word lines 329, 331 is capable of activating dummy memory cells $328_A$, $330_A$ while deactivating the dummy memory cells $328_B$, $330_B$ in a pattern as shown in FIG. 3B. This may deactivate and/or "float" the strings coupled to the deactivated dummy memory cells. In one example, dummy memory cells $328_B$, $330_B$ may be programmed to have target threshold voltages of 0V while dummy memory cells $328_A$, $330_A$ may be programmed to have target threshold voltages greater than 0V and less than 5V. In this manner, a control signal having a voltage greater than the threshold voltage of dummy memory cells $328_A$ (e.g., 5V) that is applied to dummy word line 329 and a control signal having a voltage greater than or equal to the threshold voltage of dummy memory cells $330_B$ but less than the threshold voltage of dummy memory cells $330_A$ applied to dummy word line 331, for example, 0V, would activate all dummy memory cells $328_B$ and activate all dummy memory cells $328_A$, and while the dummy memory cells $330_B$ would be activated, dummy memory cells $330_A$ would remain deactivated. As a result, strings $306_0$ through $306_3$ may be coupled to the SRC 316 when the source select gates 310 are activated by an active control signal provided on the SGS control line 314, while strings $306_4$ and $306_7$ remain decoupled from the SRC 316. Similarly, a control signal having a voltage greater than the threshold voltage of dummy memory cells $330_A$ (e.g., 5V) that is applied to dummy word line 331 and a control signal having a voltage greater than or equal to the threshold voltage of dummy memory cells $328_B$ but less than the threshold voltage of dummy memory cells $328_A$ applied to dummy word line 329, for example, 0V, would activate all dummy memory cells $330_B$ and activate all dummy memory cells $330_A$, and while the dummy memory cells $328_B$ would be activated, dummy cells $328_A$ would remain deactivated. As a result, strings $306_0$, $306_1$, $306_4$, and $306_5$ may be coupled to the SRC 316 when the source select gates 310 are activated by an active control signal provided on the SGS control line 314, while strings $306_2$, $306_3$, $306_6$, and $306_7$ remain decoupled from the SRC 316. Other threshold voltage levels may be used without departing from the scope of the invention. By programming the two dummy word lines with dummy cells of two different threshold voltages, the gate-to-channel capacitance may be reduced by half because one-half of the eight strings are coupled to the SRC 316 while the other half of the eight strings remain floating during a memory access operation.

In certain embodiments, more than two dummy word lines may be used. FIG. 3C illustrates an alternate configuration of the dummy memory cells in subblock 300C according to an embodiment of the invention. The subblock 300C includes four dummy word lines, which may have similar components to subblock 300A. The discussion of these components will not be repeated with respect to FIG. 3C, as like reference numerals describe substantially similar components. In the embodiment illustrated in FIG. 3C, each word line 329, 331, 333, 335 has three dummy cells 328, 330, 332, 334 programmed to a first state and a fourth dummy cell 328, 330, 332, 334 programmed to a second state. The dummy cells may be arranged such that each string includes only one dummy cell programmed to the second state. Although a sequential pattern is shown in FIG. 3C, other patterns may be possible. The dummy word lines 329, 331, 333, 335 may have dummy memory cells $328_L$, $328_H$, $330_L$, $330_H$, $332_L$, $332_H$, and $334_L$, $334_H$ respectively, that are programmed to have threshold voltages arranged such that a control signal applied to each of the dummy word lines 329, 331, 333, 335 is capable of activating dummy memory cells $328_L$, $330_L$, $332_L$, $334_L$ while deactivating the dummy memory cells $328_H$, $330_H$, $332_H$, $334_H$ in a pattern as shown in FIG. 3C. This may deactivate and/or "float" the strings coupled to the deactivated dummy memory cells. In one example, dummy memory cells $328_L$, $330_L$, $332_L$, $334_L$ could have target threshold voltages of 0V while dummy memory cells $328_H$, $330_H$, $332_H$, $334_H$ could have target threshold voltages greater than 0V and less than 5V.

In this manner, a control signal having a voltage greater than the threshold voltage of dummy memory cell $328_L$ but less than the threshold voltage of $328_H$ (e.g., 3V) that is applied to dummy word line 329 and a control signal having a voltage greater than or equal to the threshold voltage of dummy memory cells $330_H$, $332_H$, $334_H$ applied to dummy word lines 331, 333, 335, for example, 5V, would activate dummy memory cell $328_L$ and deactivate all dummy memory cell $328_H$, and the dummy memory cells $330_L$, $332_L$, $334_L$ would be activated, as well as cells $330_H$, $332_H$, $334_H$. As a result, string $306_0$ may be coupled to the SRC 316 when the source select gates 310 are activated by an active control signal provided on the SGS control line 314, while strings $306_1$, $306_2$, and $306_3$ remain decoupled from the SRC 316. Similarly, a control signal having a voltage greater than the threshold voltage of dummy memory cell $330_L$ but less than the threshold voltage of $330_H$ (e.g., 3V) applied to dummy word line 331 and a control signal having a voltage greater than or equal to the threshold voltage of dummy memory cells $328_H$, $332_H$, $334_H$ applied to dummy word lines 329, 331, 333, for example, 5V, would activate dummy memory cells $330_L$ and deactivate all dummy memory cell $330_H$, and the dummy memory cells $328_L$, $332_L$, $334_L$ would be activated, as well as cells $328_H$, $332_H$, $334_H$. As a result, string $306_1$ may be coupled to the SRC 316 when the source select gates 310 are activated by an active control signal provided on the SGS control line 314, while strings $306_0$, $306_2$, $306_3$ remain decoupled from the SRC 316.

Similar operations may be performed for a control signal having as voltage greater than the threshold voltage of dummy memory cell $332_L$ but less than the threshold voltage of $332_H$ (e.g., 3V) that is applied to dummy word line 333 and a control signal having a voltage greater than or equal to the threshold voltage of dummy memory cells $328_H$, $330_H$, $334_H$ (e.g., 5V) that is applied to dummy word lines 329, 331, 335, as well as for a control signal having as voltage greater than the threshold voltage of dummy memory cell $334_L$ but less than $334_H$ (e.g., 3V) that is applied to dummy word line 335 and a control signal having a voltage greater than or equal to the threshold voltage dummy memory cells $328_H$, $330_H$, $332_H$ (e.g., 5V) that is applied to dummy word lines 329, 331, 333. Other threshold voltage levels may be used without departing from the scope of the invention. By utilizing four dummy word lines, the capacitance may be reduced to one-fourth of its original value by coupling only one of four strings to the SRC 316 and allowing the three other strings to remain floating during a memory access operation.

Example configurations using two and four dummy word lines have been described, but other configurations using different numbers of dummy word lines may be possible without departing from the scope of the invention. For example, the arrangement of the relatively low and relatively high target threshold voltages of the dummy memory cells may be reversed such that each dummy word line has one dummy cell with a relatively high target threshold voltage.

Figure 4:
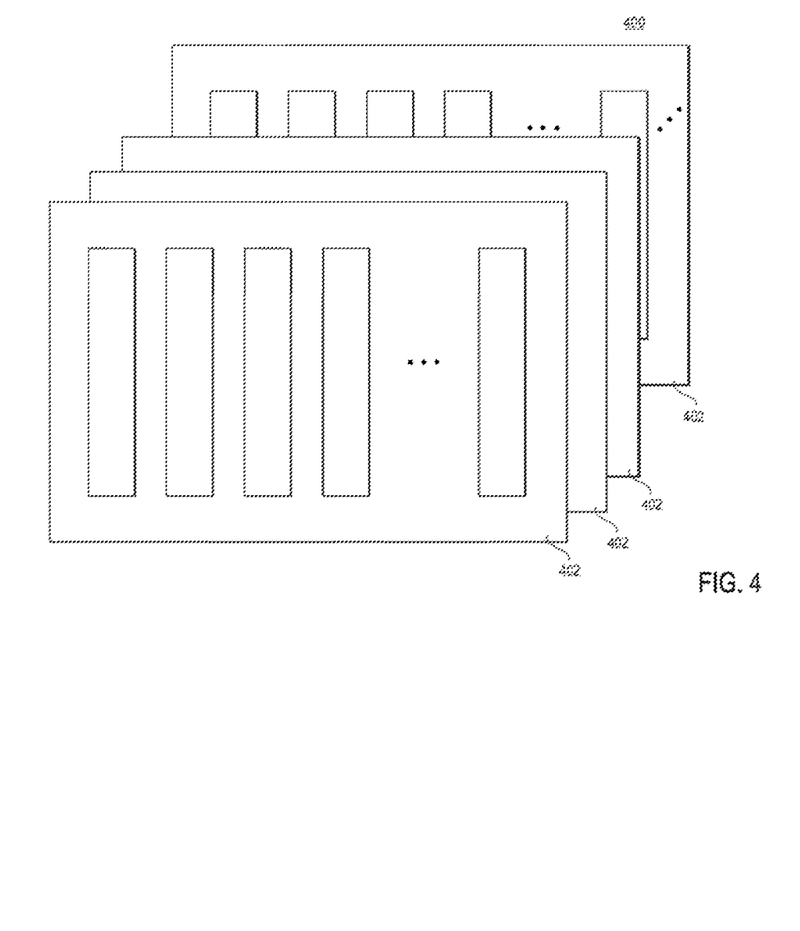
FIG. 4 is a block diagram of a three-dimensional memory array according to an embodiment of the present invention.

In some examples, the block 100 may be implemented in a using vertical NAND (VNAND) memory strings. FIG. 4 is a block diagram of a VNAND memory array 400 according to an embodiment of the present invention. The memory array 400 may include any number of blocks 402, one or more of which may be implemented using the block 100 of FIG. 1. By way of example, the memory array 400 may include 32 blocks 402, or may include 64 blocks 402. In some examples, memory cells of each block 402 may be accessed concurrently, simultaneously, and/or in an otherwise overlapping manner such that data may be read from, programmed to, and/or erased from multiple blocks 402 in accordance with one or more memory operations. In other examples, the blocks 402 may be configured to share one or more components, such as signal lines and/or control lines.

Figure 5:
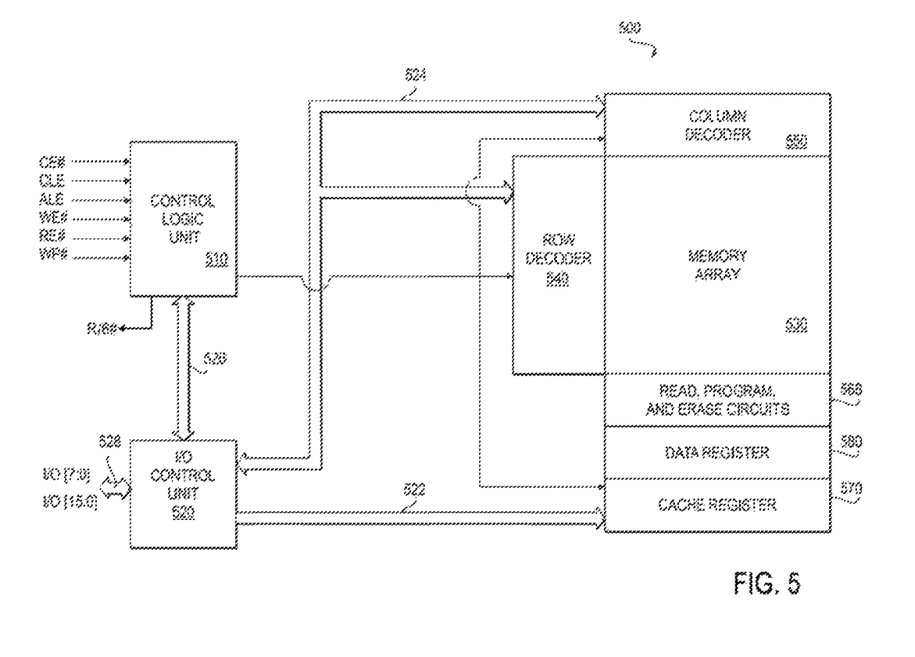
FIG. 5 is a block diagram of a memory according to an embodiment of the present invention.

FIG. 5 illustrates a memory 500 according to an embodiment of the present invention. The memory 500 includes a memory array 530 with a plurality of memory cells. The memory cells may be non-volatile memory cells or may generally be any type of memory cells. In some examples, the memory array 530 may include one or more memory blocks, such as one or more of the memory blocks previously described. Moreover, the memory array 530 may be implemented as a VNAND memory array, such as the VNAND memory array 400 of FIG. 4.

Command signals, address signals, and write data signals may be provided to the memory 500 as sets of sequential input/output ("I/O") signals transmitted through an I/O bus 528. Similarly, read data signals may be provided from the memory 500 through the I/O) bus 528. The I/O bus 528 is connected to an I/O control unit 520 that routes the signals between the I/O bus 528 and an internal data bus 522, an internal address bus 524, and an internal command bus 526. The memory 500 also includes a control logic unit 510 that receives a number of control signals either externally or through the internal command bus 526 to control the operation of the memory 500.

The internal address bus 524 applies block-row and/or subblock-row address signals to a row decoder 540 and column address signals to a column decoder 550. The row decoder 540 and column decoder 550 may be used to select blocks of memory or memory cells for memory operations, for example, read, program, and erase operations. The column decoder 550 may enable write data signals to be applied to columns of memory corresponding to the column address signals and allow read data signals to be coupled from columns corresponding to the column address signals.

In response to the memory commands decoded by the control logic unit 510, the memory cells in the memory array 530 are read, programmed, and/or erased. Read, program, erase circuits 568 coupled to the memory array 530 receive control signals from the control logic unit 510 and include voltage generators (e.g., charge pumps) for generating various pumped voltages for read, program and erase operations. The control logic unit 510 may provide controls signals to the memory circuits to program dummy memory cells, and to provide control signals to dummy word lines of the memory array 530 to reduce gate-to-channel capacitance of the strings during memory access operations according to an embodiment of the invention, for example, as previously described.

After the row address signals have been applied to the internal address bus 524, the I/O control unit 520 routes write data signals to a cache register 570. The write data signals are stored in the cache register 570 in successive sets each having a size corresponding to the width of the I/O bus 528. The cache register 570 sequentially stores the sets of write data signals for an entire page (e.g., row or part of a row) of memory cells in the memory array 430. All of the stored write data signals are then used to program a page of memory cells in the memory array 530 selected by the block-row address or subblock-row address coupled through the internal address bus 524. In a similar manner, during a read operation, data signals from a row or block of memory cells selected by the block-row address coupled through the internal address bus 524 are stored in a data register 580. Sets of data signals corresponding in size to the width of the I/O bus 528 are then sequentially transferred through the I/O control unit 520 from the data register 580 to the I/O bus 528.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a first memory string including first and second dummy memory cells;
   a second memory string including third and fourth dummy memory cells; and
   a control unit configured to provide first and second control signals to activate the first and second dummy memory cells of the first memory string and to further deactivate at least one of the third and fourth dummy memory cell of the second memory string.

2. The apparatus of claim 1, wherein the first memory string and the second memory string are adjacent.

3. The apparatus of claim 1, wherein the first dummy memory cell has a first target threshold voltage and the third dummy memory cell has a second target threshold voltage different from the first target threshold voltage.

4. The apparatus of claim 3, wherein the second target threshold voltage is greater than the first target threshold voltage.

5. The apparatus of claim 3, wherein the control signal is greater than the first target threshold voltage and less than the second target threshold voltage.

6. The apparatus of claim 3, wherein the first target threshold voltage comprises a first range of voltages, the second target threshold voltage comprises a second range of voltages, and the first range of voltages is nonoverlapping with the second range of voltages.

7. The apparatus of claim 6, wherein the first range of voltages is from 0V to 2V and the second range of voltages is from 4V to 6V.

8. An apparatus comprising:
   a first plurality of cells respectively coupled to a bitline of a first set of adjacent bitlines and a wordline, the first plurality of cells having a first target threshold voltage; and
   a second plurality of cells respectively coupled to a bitline of a second set of adjacent bitlines and the wordline, the second plurality of cells having a second target threshold voltage,
   wherein a control signal provided to the wordline is configured to activate the first plurality of cells and to deactivate the second plurality of cells.

9. The apparatus of claim 8, further comprising:
   a third plurality of cells, each cell of the third plurality of cells coupled to a bitline of the first set of adjacent bitlines or the second set of adjacent bitlines, the third plurality of cells having the second target threshold.

10. The apparatus of claim 9, wherein each bitline of first and second sets of bitlines is coupled to a cell of the third plurality of cells.

11. The apparatus of claim 9, wherein the third plurality of cells are coupled to a second wordline.

12. The apparatus of claim 11 further comprising:
   a control unit configured to provide a first control signal to the wordline to activate the second plurality of cells and to deactivate the first plurality of cells and to provide a second control signal to the second wordline to activate the third plurality of cells.

13. The apparatus of claim 8, wherein the second set of bitlines are floating when the second plurality of cells are deactivated.

14. A method comprising:
providing a control signal to a plurality of dummy memory cells respectively coupled to adjacent bitlines;
activating a first set of dummy memory cells of the plurality of dummy memory cells coupled to a first set of alternating bitlines of the adjacent bitlines, responsive to the control signal; and
deactivating a second set of dummy memory cells of the plurality of dummy memory cells coupled to a second set of alternating bitlines of the adjacent bitlines, responsive to the control signal.

15. The method of claim 14, wherein the first set of dummy memory cells has a first target threshold voltage and the second set of dummy memory cells has a second target threshold voltage.

16. The method of claim 15, wherein the first target threshold voltage is less than the second target threshold voltage.

17. The method of claim 16, wherein the control signal applies a voltage that is greater than the first target threshold voltage and less than the second target threshold voltage.

18. The method of claim 15, wherein first target threshold voltage comprises a first range of voltages, the second target threshold voltage comprises a second range of voltages, and the first range of voltages is nonoverlapping with the second range of voltages.

19. The method of claim 14, wherein the control signal is provided to a wordline that is coupled to the first and second sets of dummy memory cells.

20. The method of claim 14, wherein bitlines of the first set of alternating bitlines are disposed between bitlines of the second set of alternating bitlines.

21. An apparatus comprising:
a first memory string comprising a first set of transistors comprising first and second transistors and a second set of transistors;
a second memory string comprising a third set of transistors comprising third and fourth transistors and a fourth set of transistors;
the first memory string further comprising a fifth transistor located at one edge of the first memory string and coupled to a bit line and a sixth transistor located at other edge of the first memory string and coupled to a source, and the first and second sets of transistors coupled between the fifth transistor and the sixth transistor;
the second memory string further comprising a seventh transistor located at one edge of the second memory string and coupled to the bit line and a eighth transistor located at other edge of the second memory string and coupled to the source, and the third and fourth sets of transistors coupled between the seventh transistor and the eighth transistor;
the first and third transistors configured to be turned on responsive to a first control signal during a memory access operation to access at least one of transistors of the second and fourth sets of transistors; and
at least one of the second and fourth transistors configured to be turned off responsive to a second control signal during the memory access operation to access the at least one of transistors of the second and fourth sets of transistors.

22. The apparatus of claim 21, comprising:
a control unit configured to provide the first control signal to gates of the first and third transistors to turn the first and second transistors on and further provide the second control signal to gates of the second and fourth transistors to turn the at least one of the second and fourth transistors off, during the memory access operation to access the at least one of transistors of the second and fourth sets of transistors.

23. The apparatus of claim 21, wherein:
the first set of transistors further comprises a ninth transistor;
the third set of transistors further comprises a tenth transistor; and
the ninth and tenth transistors are configured to be turned on responsive to a third control signal during the memory access operation to access the at least one of transistors of the second and fourth sets of transistors.

24. The apparatus of claim 21, wherein the first memory string and the second memory string are adjacent.

25. The apparatus of claim 21, wherein the memory access operation is a read operation.

26. The apparatus of claim 21, wherein the memory access operation is a write operation.

27. The apparatus of claim 21, comprising:
a NAND memory array comprising the first memory string and the second memory string.

* * * * *